United States Patent [19]

Okatani et al.

[11] Patent Number: 5,592,650
[45] Date of Patent: Jan. 7, 1997

[54] COMPUTER APPARATUS AND METHOD FOR REPLACING PROGRAMS BETWEEN MEMORIES BY EMPLOYING PROTECTION MECHANISM WITH WRITE ENABLE GENERATION SCHEME

[75] Inventors: Toru Okatani, Kobe; Yoichi Kawabuchi; Syuzi Maruta, both of Toyokawa; Keiichi Nomura, Amagasaki, all of Japan

[73] Assignee: Minolta Camera Kabushiki Kaisha, Osaka, Japan

[21] Appl. No.: 86,159

[22] Filed: Jul. 2, 1993

[30] Foreign Application Priority Data

Jul. 7, 1992 [JP] Japan .................................. 4-179872

[51] Int. Cl.⁶ .............................................. G06F 12/16
[52] U.S. Cl. ........................ 395/490; 395/488; 395/442
[58] Field of Search ................... 364/200 MS, 900 MS; 395/425, 442, 429, 430, 492, 490, 488, 489

[56] References Cited

U.S. PATENT DOCUMENTS

| | | | |
|---|---|---|---|
| 4,229,804 | 10/1980 | Kobayashi et al. | 395/442 |
| 4,725,977 | 2/1988 | Izumi et al. | 395/442 |
| 4,796,181 | 1/1989 | Wiedemer | 364/406 |
| 4,984,193 | 1/1991 | Nakagawa | 395/442 |
| 5,131,091 | 7/1992 | Mizuta | 395/186 |
| 5,150,455 | 9/1992 | Morikawa et al. | 395/114 |
| 5,245,582 | 9/1993 | Kimura | 365/229 |
| 5,276,903 | 1/1994 | Shinagawa | 395/800 |
| 5,293,601 | 3/1994 | Tsuyuguchi et al. | 395/425 |
| 5,349,669 | 9/1994 | Arai et al. | 395/750 |
| 5,359,726 | 10/1994 | Thomas | 395/500 |
| 5,377,357 | 12/1994 | Nishigaki et al. | 395/800 |
| 5,386,539 | 1/1995 | Nishi | 395/442 |
| 5,386,541 | 1/1995 | Moridara | 395/431 |
| 5,410,707 | 4/1995 | Bell | 395/442 |
| 5,426,762 | 6/1995 | Nakagawa | 395/442 |

FOREIGN PATENT DOCUMENTS

58-199388  11/1983  Japan .

Primary Examiner—Matthew M. Kim
Attorney, Agent, or Firm—Brinks, Hofer, Gilson & Lione

[57] ABSTRACT

A program replacement device is incorporated in a computer system having a CPU and a program memory in which first programs to be executed by the CPU are stored. The program replacement device includes a RAM employed as the program memory and having a write enable terminal, and a protection circuit interposed between the write enable terminal of the program memory and a write signal outputted from the CPU. The protection circuit includes a push switch for instructing program replacement with respect to the program memory, a pulse generating circuit for generating a pulse signal having a given time interval in response to an instruction from the push switch, and a gate circuit for making, only when the pulse signal is generated, the write signal outputted from the CPU valid with respect to the write enable terminal of the program memory. The program replacement device further includes an interruption generating circuit for generating in the CPU an interruption required to write second programs in the program memory in response to the instruction from the instruction section, thereby replacing the first programs by the second programs.

13 Claims, 5 Drawing Sheets

| S2 | S3 | S4 |
|----|----|----|
| L  | H  | H  |
| L  | L  | L  |
| H  | H  | —  |
| H  | L  | —  |

COMPUTER APPARATUS AND METHOD FOR REPLACING PROGRAMS BETWEEN MEMORIES BY EMPLOYING PROTECTION MECHANISM WITH WRITE ENABLE GENERATION SCHEME

BACKGROUND OF THE INVENTION

1. Field of the Invention

The present invention relates to a program replacement method and device for use in a computer system.

2. Description of the Prior Art

A ROM (Read-Only Memory) in which data can be written only once is in wide practical use today as a program memory for storing main programs. Because normal access to a central processing unit (CPU) cannot rewrite the ROM, the ROM is generally used as an appropriate memory element for storing the main programs which must not be modified or altered.

In recent years, because the quantity of programs is increasing and the contents thereof become complicated, such cases that bugs are discovered in the programs after products have appeared on the market are increasing. In such cases, replacement of the ROM is generally carried out with respect to computer systems in operation on the market in order for the defective programs to be replaced by modified programs with no bugs.

Furthermore, the program replacement is also required to enhance the version of the systems or to enhance system functions at the time an optional appliance or appliances are additionally connected to the systems, as well as to modify the bugs. The replacement of the ROM is also carried out for this purpose.

However, the replacement of the ROM requires, when carried out with respect to computer systems in operation on the market, much time and labor. In view of this fact, Japanese Laid-open Patent Publication No. 58-199388 discloses a ROM cassette in which a ROM is incorporated and which is removably mounted in a computer system. When replacement of programs is required, the ROM cassette is replaced by another. In this instance, the ROM cassette is designed as a replaceable type and is adapted to be connected to the CPU through, for example, a connector.

This method, however, has a problem in that the simpler the replaceable design is made, the more susceptible the ROM cassette is to external disturbance such as, for example, noises or static electricity. Hence, the system as a whole will be apt to result in an erroneous operation.

To overcome this problem, the use of a random access memory element (RAM) in which programs can be written and read has been proposed. According to this method, the system control is normally carried out by reading programs from the RAM. When replacement of the programs is required, an external memory element having programs by which the programs stored in the RAM are desired to be replaced is connected to the system, and the programs stored in the external memory element are transferred to the RAM.

This method, however, has a problem in reliability in program storage, which is primarily caused by the property of the RAM. The reason for this is discussed hereinbelow.

The RAM generally has a write enable terminal (WE terminal) to distinguish between the reading and writing of data. The WE terminal allows, only when a signal directed thereto is enabled, data to be written in the RAM, and at the same time, functions to prevent the contents of the RAM from being unexpectedly rewritten.

Furthermore, the RAM generally has a chip selection terminal (CS terminal) in addition to the WE terminal. Unless two signals directed to these terminals are both enabled, the data i.e., rewriting the programs stored in the RAM is not allowed. Because a circuit is so designed as to disable, when no signal is outputted from the CPU, both of the terminals, there is little chance to enable the two terminals at the same time even in the presence of noises or the like, and hence, it is unlikely that the data in the RAM would be unexpectedly rewritten.

However, if the CPU is shut down by any reason, the data in the RAM may be rewritten by an error signal from the CPU. Accordingly, a problem is encountered in reliability in the case where the RAM is used for storage of the main programs by the normal connection method.

One of methods to overcome this kind of problem is the provision of a dip switch interposed between the WE terminal of the RAM and a write signal outputted from the CPU. In this case, only when the dip switch is turned on, the write signal from the CPU is transmitted to the RAM.

The dip switch is, however, a change-over switch of the type wherein, even if the operation force is removed, the ON/OFF state immediately before the removal of the operation force is held. Accordingly, the rewriting of the RAM depends upon not the circuit itself but the operation of an operator.

More specifically, if the operator has forgotten changing over the switch, a write signal output terminal of the CPU and the WE terminal of the RAM are left connected, and in this case, the provision of the switch may make no sense. In addition, it is likely that the operator leaves the system with the switch ON.

Accordingly, in applications where the dip switch is employed, the reliability of the system depends upon the reliability in operation i.e., whether or not the operator turns off the dip switch. Although the provision of the dip switch is helpful to call an operator's attention in rewriting the programs, it cannot be expected that storing the programs in the RAM would enhance the reliability of the system.

SUMMARY OF THE INVENTION

The present invention has been developed to overcome the above-described disadvantages.

It is accordingly an object of the present invention to provide a program replacement method and apparatus capable of readily performing program replacement without reducing the reliability in program storage.

In accomplishing the above and other objects, a program replacement device according to the present invention includes a memory element in which data can be written and read and which is employed as a program memory in which first programs to be executed by a CPU are stored. The program replacement device further includes a protection circuit interposed between a write enable terminal of the program memory and a write signal outputted from the CPU. The protection circuit includes an instruction section for instructing program replacement with respect to the program memory, a pulse generating circuit for generating a pulse signal having a given time interval in response to an instruction from the instruction section, and a gate circuit for making, only when the pulse signal is generated, the write signal outputted from the CPU valid with respect to the write enable terminal of the program memory. The program replacement device also includes an interruption generating circuit for generating in the CPU an interruption required to write second programs in the program memory in response to the instruction from the instruction section, thereby replacing the first programs by the second programs.

The present invention is also directed to a program replacement method including the steps of: utilizing, as a program memory in which first programs to be executed by a CPU are stored, a memory element in which data can be written and read; and providing a protection circuit between a write enable terminal of the program memory and a write signal outputted from the CPU. The protection circuit includes an instruction section for instructing program replacement with respect to the program memory, a write enable signal generating circuit for generating a write enable signal having a given time interval in response to an instruction from the instruction section, and a gate circuit for making, only when the write enable signal is generated, the write signal outputted from the CPU valid with respect to the write enable terminal of the program memory. The program replacement method according to the present invention further includes the steps of: generating the write enable signal in response to the instruction from the instruction section; and writing second programs in the program memory, thereby replacing the first programs by the second programs.

In another aspect of the present invention, a program replacement method includes the steps of: utilizing, as a program memory in which first programs to be executed by a CPU are stored, a memory element in which data can be written and read; preparing an external memory having second programs stored therein; connecting the external memory to the computer system, thereby connecting a write enable terminal of the program memory to a write signal outputted from the CPU; generating an interruption with respect to the CPU; and transferring the second programs stored in the external memory to the program memory, thereby replacing the first programs by the second programs.

The program memory as employed in the present invention is a memory in which data or programs can be written and read, and on the occasion of program replacement, the second programs by which the first programs are desired to be replaced are written in the program memory. In writing the second programs, the write enable signal is generated in response to the instruction from the instruction section, thereby opening the gate circuit. As a result, the write signal from the CPU can be inputted to the write enable terminal of the program memory.

When a predetermined time period has elapsed after the instruction from the instruction section, or where no instruction is given from the instruction section, the write enable signal disappears or no write enable signal is generated, and hence, the gate circuit is closed. In this case, even though the write signal is outputted from the CPU, this signal is not inputted to the write enable terminal of the program memory. Accordingly, the contents of the program memory is prevented from being rewritten, and the programs stored therein is reliably maintained.

BRIEF DESCRIPTION OF THE DRAWINGS

The above and other objects and features of the present invention will become more apparent from the following description of preferred embodiments thereof with reference to the accompanying drawings, throughout which like parts are designated by like reference numerals, and wherein:

FIG. 5b is a table indicating the state of signals at several locations in the gate circuit of FIG. 5a;

DETAILED DESCRIPTION OF THE PREFERRED EMBODIMENTS

Figure 1:
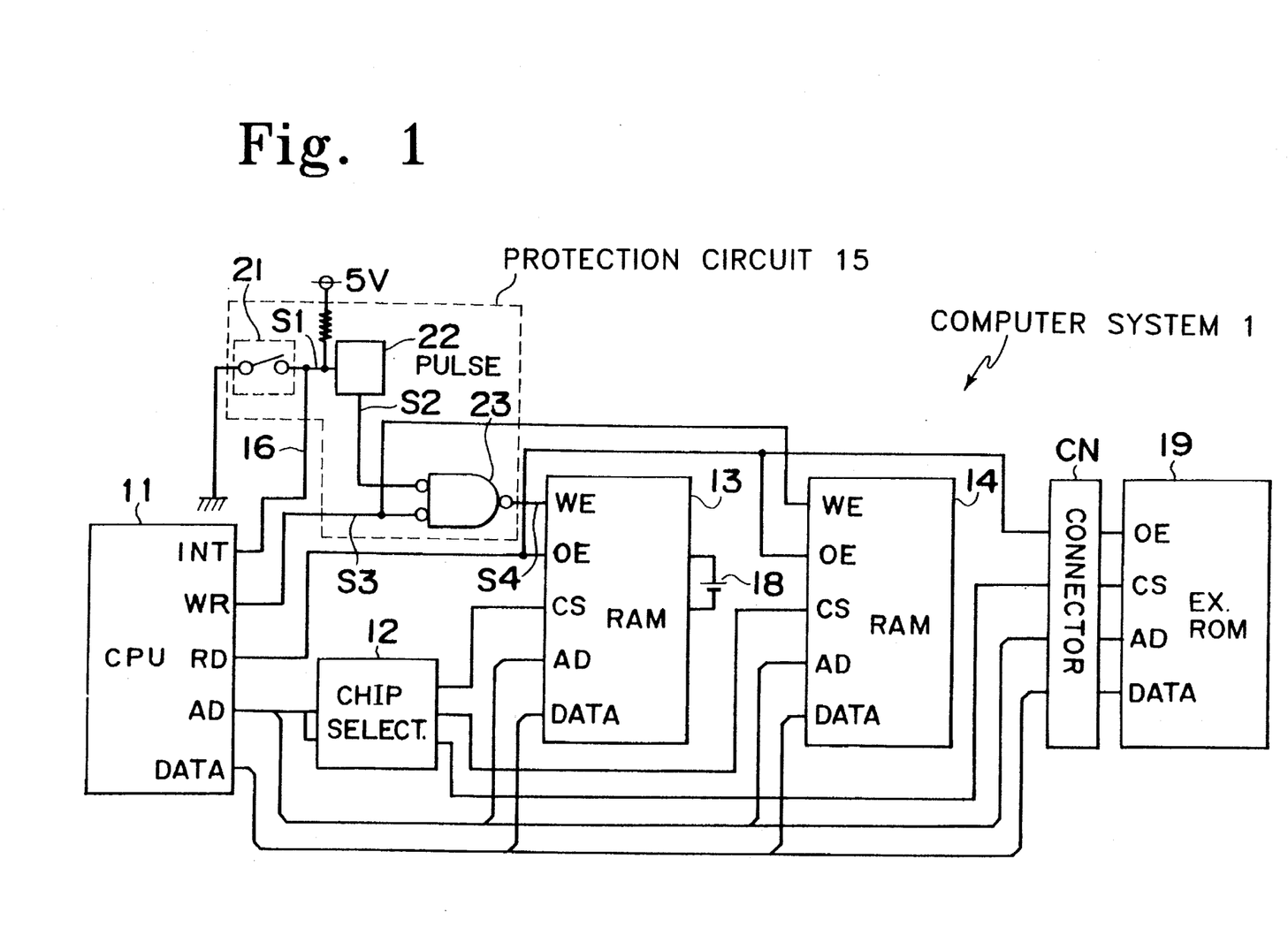
FIG. 1 is a block diagram of a computer system according to a first embodiment of the present invention.
Figure 2:
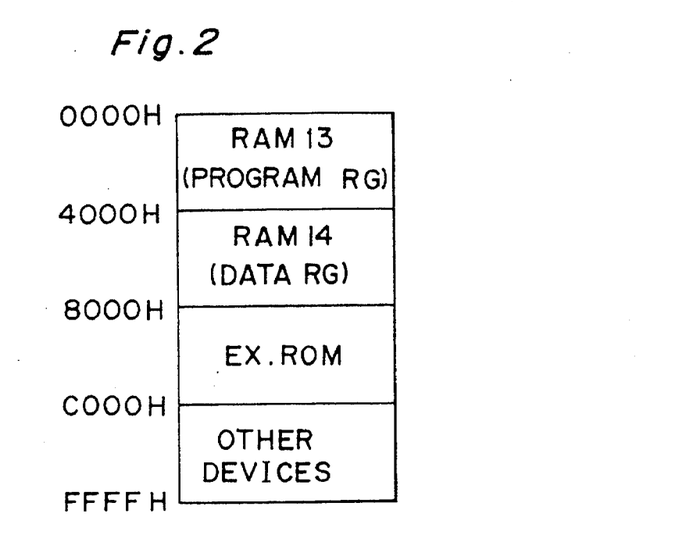
FIG. 2 is a schematic view of a memory map of the computer system.

Referring now to the drawings, there is shown in FIG. 1 a computer system 1 according to a first embodiment of the present invention. The computer system 1 comprises a CPU 11, a chip selector 12, two RAMs 13 and 14, a protection circuit 15, a connector CN, and the like. In this computer system 1, the RAM 13 is allocated from the first address of a memory region, as shown in FIG. 2, and a main program or programs which the CPU 11 executes are stored therein. The RAM 14 is allocated to a portion of the memory region next to the RAM 13 and is utilized as a data storage region or a working region.

Each of the RAMs 13 and 14 is a memory in which data can be written and read, and has a write enable (WE) terminal, a chip selection (CS) terminal, and some other terminals including an output enable (OE) terminal, an address (AD) terminal and a data (DATA) terminal. When the WE terminal receives a signal, data write into the memory is permitted. When the OE terminal receives a signal, data read from the memory is permitted. When the CS terminal receives a signal, a chip is selected. An address signal is inputted via the AD terminal, and data read/write is executed at the address designated by the inputted address signal. Data input and output to and from the memory is executed via the DATA terminal. When both of the WE terminal and CS terminal are enabled, writing is allowed. The RAM 13 is connected to a backup power 18, which holds the programs stored in the RAM 13.

The CPU 11 reads and executes the programs stored in the RAM 13 to thereby control the whole computer system 1. The CPU 11 includes an interrupt port (INT), a write request port (WR), and other ports including a read port (RD), an address port (AD) and a data port (DATA). When the INT port receives a signal, the CPU executes an interrupt processing. A signal from the WR port is outputted to the WE terminal of a memory to thereby bring the memory into a data write enable state. A signal from the RD port is outputted to the OE terminal of a memory to thereby bring the memory into a data read enable state. A signal designating an address is outputted from the AD port to the AD terminal of a memory. Data input and output to and from a memory are executed via the DATA port. When the CPU 11 receives an interruption request at the INT port from a push switch 21 via an interruption circuit 16, the CPU 11 executes an interruption processing to transfer data from an external ROM card 19 to the RAM 13. The push switch 21 is discussed later.

When a write signal S3 is outputted from the WR port of the CPU 11, the protection circuit 15 is allowed to output a write signal S4 to the WE terminal of the RAM 13 only under a given condition, thereby protecting the programs stored in the RAM 13 from being unexpectedly altered. The protection circuit 15 comprises a push switch 21, a pulse generating circuit 22, and a gate circuit 23.

The push switch 21 is provided to give an instruction required to replace the programs stored in the RAM 13 by other programs, and when the push switch 21 is depressed, a signal S1 is activated (active LOW-level state) and is inputted into the pulse generating circuit 22.

At the same time, the signal S1 is inputted into an interruption input terminal (INT terminal) of the CPU 11 via the interruption circuit 16, thereby starting the interruption processing to perform data (program) transfer to the RAM 13.

Upon receiving the signal S1, the pulse generating circuit 22 generates an enabling pulse signal S2 (active LOW-level signal) having a predetermined time interval.

Only when the pulse signal S2 is active, the gate circuit 23 renders the write signal S3 outputted from the WR port of the CPU 11 to be effective with respect to the WE terminal of the RAM 13. The gate circuit 23 is comprised of, for example, an OR element, or two NOT elements and a NAND element.

Figure 3:
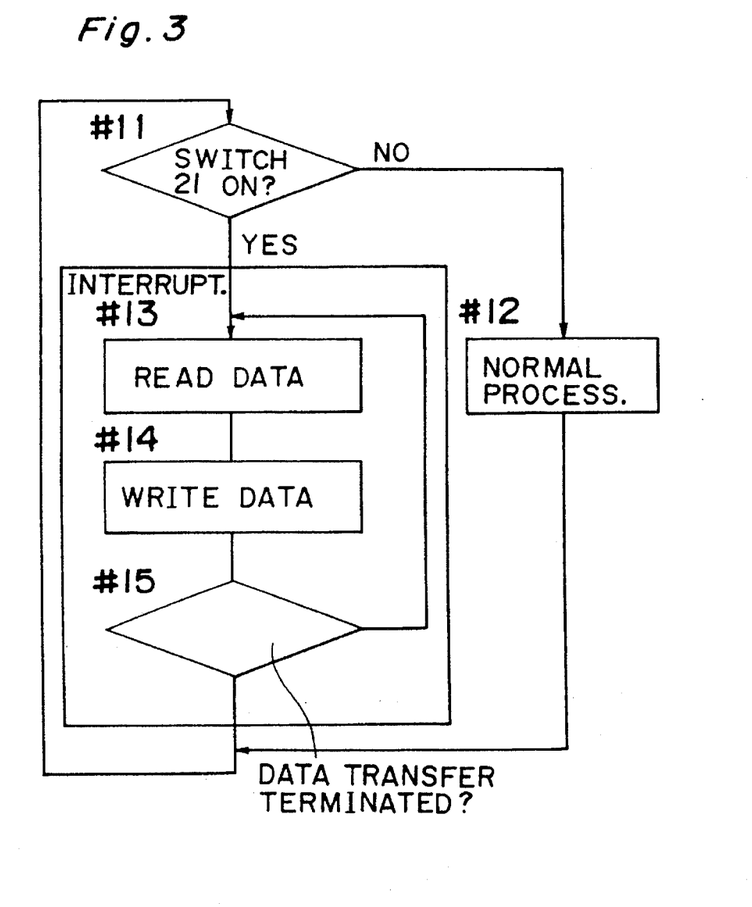
FIG. 3 is a flowchart indicating a flow of processes executed by the computer system.
Figure 4:
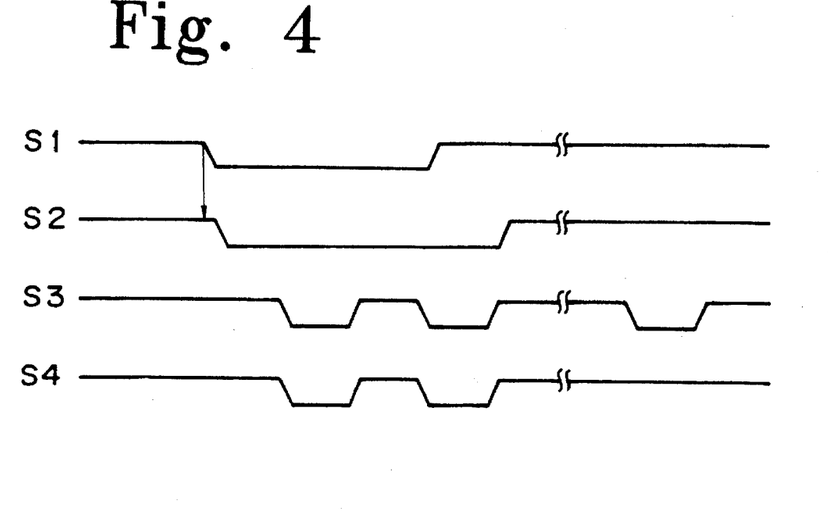
FIG. 4 is a timing chart indicating the signal state at various locations at the time a push switch has been depressed.

FIG. 3 depicts a flowchart schematically indicating processes executed by the computer system 1, and FIG. 4 depicts a timing chart indicating the signal state at various locations at the time the push switch 21 has been depressed.

Because the push switch 21 is normally kept OFF (step #11: NO), a normal processing is executed at step #12. During this period, because the pulse signal S2 is not generated, the gate circuit 23 is closed.

Accordingly, even if the write signal S3 is outputted from the CPU 11, it never happens that the WE terminal of the RAM 13 is enabled. Hence, even if the address of the RAM 13 has been designated, the contents thereof is never rewritten. In short, the programs stored in the RAM 13 is protected with certainty.

When modification, alteration, or addition is made with respect to the programs stored in the RAM 13, the external ROM card 19 is inserted into and electrically connected with a connector CN, and the push switch 21 is then depressed. The external ROM card 19, in which programs required for program modification, alteration or addition are stored, is normally accommodated in a card case. As shown in FIG. 1, the external ROM card 19 includes an OE terminal, a CS terminal, and AD terminal and a DATA terminal.

When the push switch 21 is depressed (step #11: YES), the signal S1 is activated, as shown in FIG. 4. At this moment, the pulse signal S2 having the predetermined time interval is outputted from the pulse generating circuit 22 irrespective of the time interval of the signal S1, and the gate circuit 23 is opened for a given period.

While the gate circuit 23 is opened, the CPU 11 executes the interruption processing, thereby transferring the programs stored in the external ROM card 19 to the RAM 13. During the interruption processing, the CPU 11 reads the data (programs) from the external ROM card 19 (step #13) and writes them in the RAM 13 (step #14). Such operations are repeated until the transfer of the whole data is terminated (step #15). In this way, the programs in the RAM 13 are replaced by other programs.

When replacement of the programs is terminated, the gate circuit 23 is closed, thereby inhibiting the writing in the RAM 13. Accordingly, even if an erroneous operation or a hang-up of the CPU 11 activates the write signal S3 by any reason, the WE terminal is no longer activated, as shown in FIG. 4. As a result, the contents of the RAM 13 is prevented from being rewritten, and the programs after the replacement are reliably protected.

It is sufficient if the external ROM card 19 is connected to the connector CN only when program replacement is required. For this reason, the program replacement can be performed with respect to a number of computer systems 1 using only one external ROM card 19. The programs required for the interruption processing which the CPU 11 executes can be stored in the memory region in the proximity of an end portion of the RAM 13 or any other suitable memory region.

As discussed hereinabove, according to the computer system 1 of the present invention, the replacement of the programs stored in the RAM 13 can be readily carried out by an electrical connection of the external ROM card 19 to the computer system 1 and by a subsequent simple depression of the push switch 21. Furthermore, after the replacement, the new programs are reliably stored and protected in the RAM 13.

Other various elements or a circuit can be used in place of the gate circuit 23.

Figure 5A:
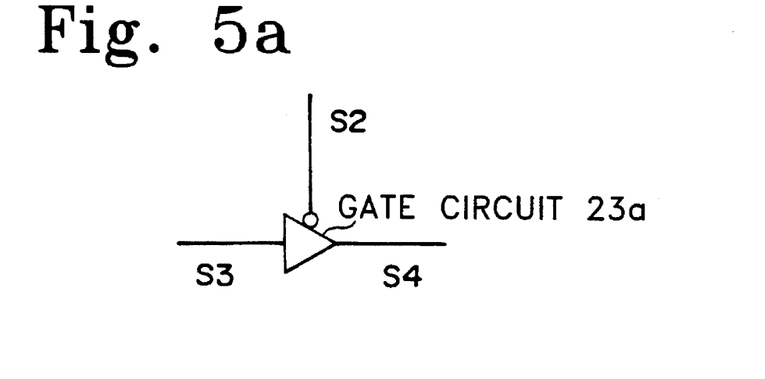
FIG. 5a is a diagram of a gate circuit provided in a protection circuit of the computer system of FIG. 1.

FIG. 5a schematically depicts another gate circuit 23a which can be employed in the protection circuit 15 shown in FIG. 1.

Figure 5B:
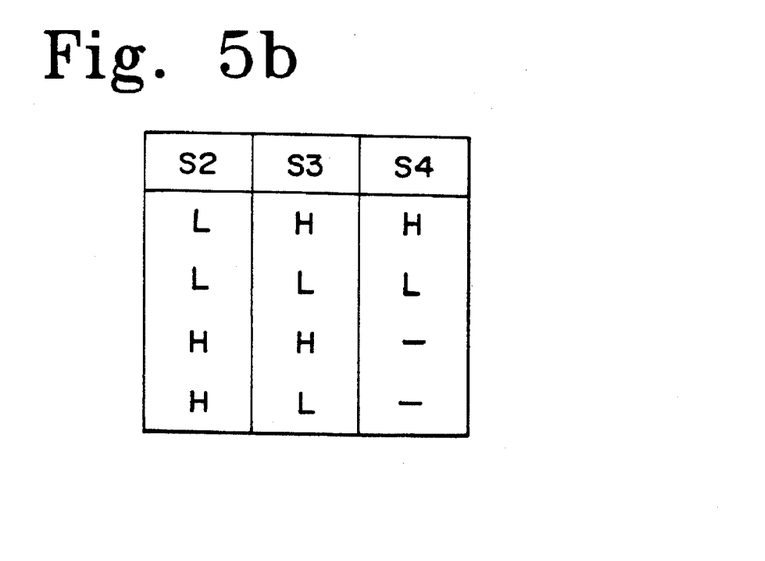

As shown in FIG. 5a, the gate circuit 23a is made up of a three-state buffer. According to this gate circuit 23a, only when the pulse signal S2 is activated (LOW), the write signal S3 is transmitted as the write signal S4 to the WE terminal, as shown in FIG. 5b. When the pulse signal S2 is deactivated (HIGH), the output of the gate circuit 23a is at a high-impedance state, and the WE terminal is not activated.

Figure 6:
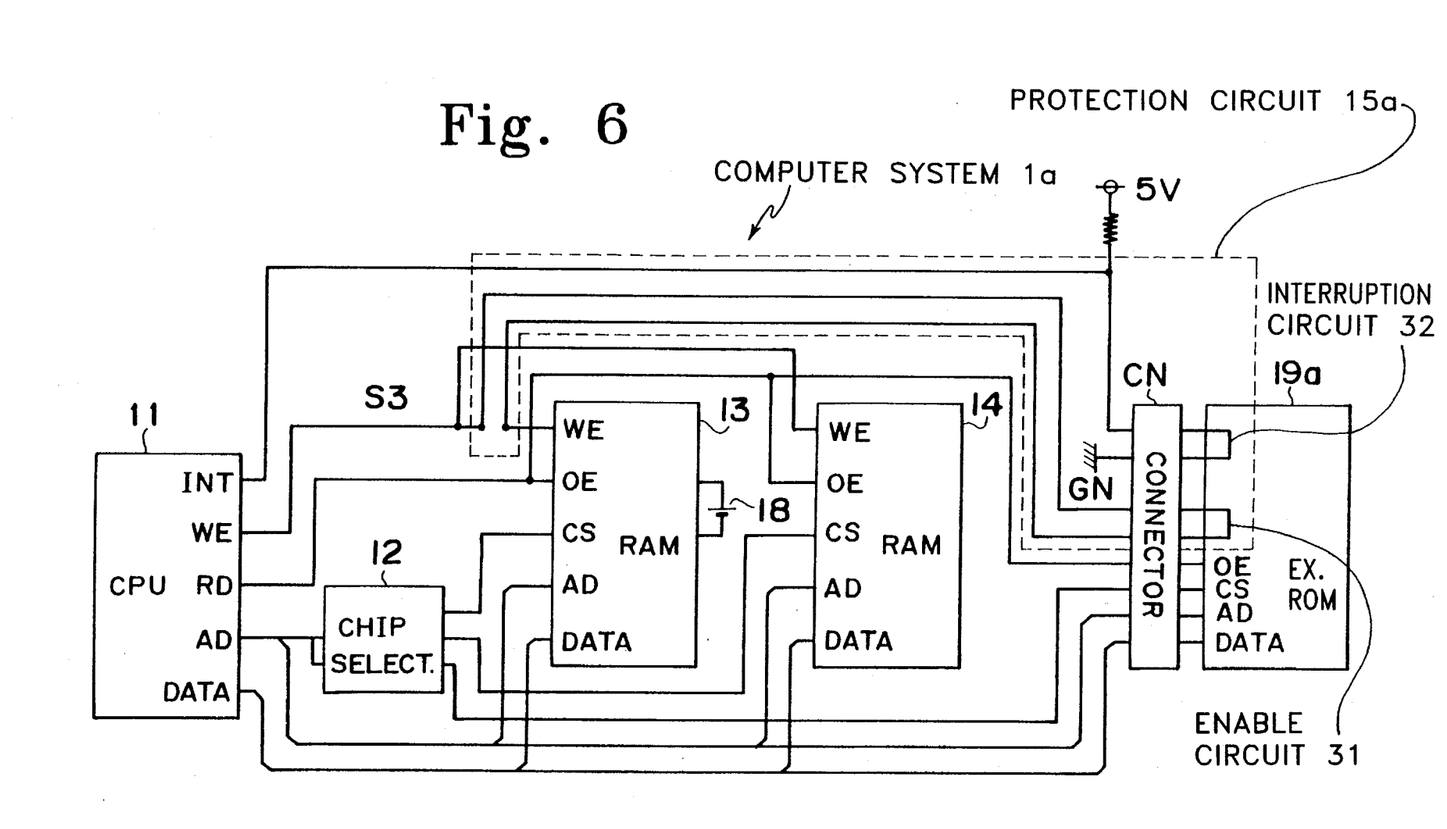
FIG. 6 is a diagram similar to FIG. 1, but according to a second embodiment of the present invention.

FIG. 6 depicts a computer system 1a according to a second embodiment of the present invention. The computer system 1a has a connector CN which can be connected to an external ROM card 19a having an enable circuit 31 and an interruption circuit 32. The enable circuit 31 is a circuit through which the write signal S3 outputted from the CPU 11 is allowed to be inputted to the WE terminal of the RAM 13. The interruption circuit 32 is a circuit required to generate an interruption with respect to the CPU 11.

Only when the external ROM card 19a is connected to the connector CN, the writing in the RAM 13 is allowed, and the interruption to the CPU 11 is generated. As a result, data transfer from the external ROM card 19a to the RAM 13 is executed and program replacement is carried out.

In other words, a protection circuit 15a employed in the second embodiment and shown in FIG. 6 has no push switch and no pulse generating circuit, unlike the protection circuit 15 employed in the first embodiment. Instead, the external ROM card 19a having the enable circuit 31 is connected to the connector CN of the computer system 1a, when the program replacement is required. At the time other than the program replacement, the external ROM card 19a is removed from the connector CN, thereby protecting the programs stored in the RAM 13.

According to this computer system 1a, the program replacement is automatically carried out merely by inserting the external ROM card 19a into the connector CN, and hence, operations required for the program replacement are facilitated.

It is to be noted that the connection between the write signal S3 from the CPU 11 and the WE terminal of the RAM 13, and the method of generating the interruption with respect to the CPU 11 are not limited by those discussed above, and other various methods can be adopted.

Figure 7:
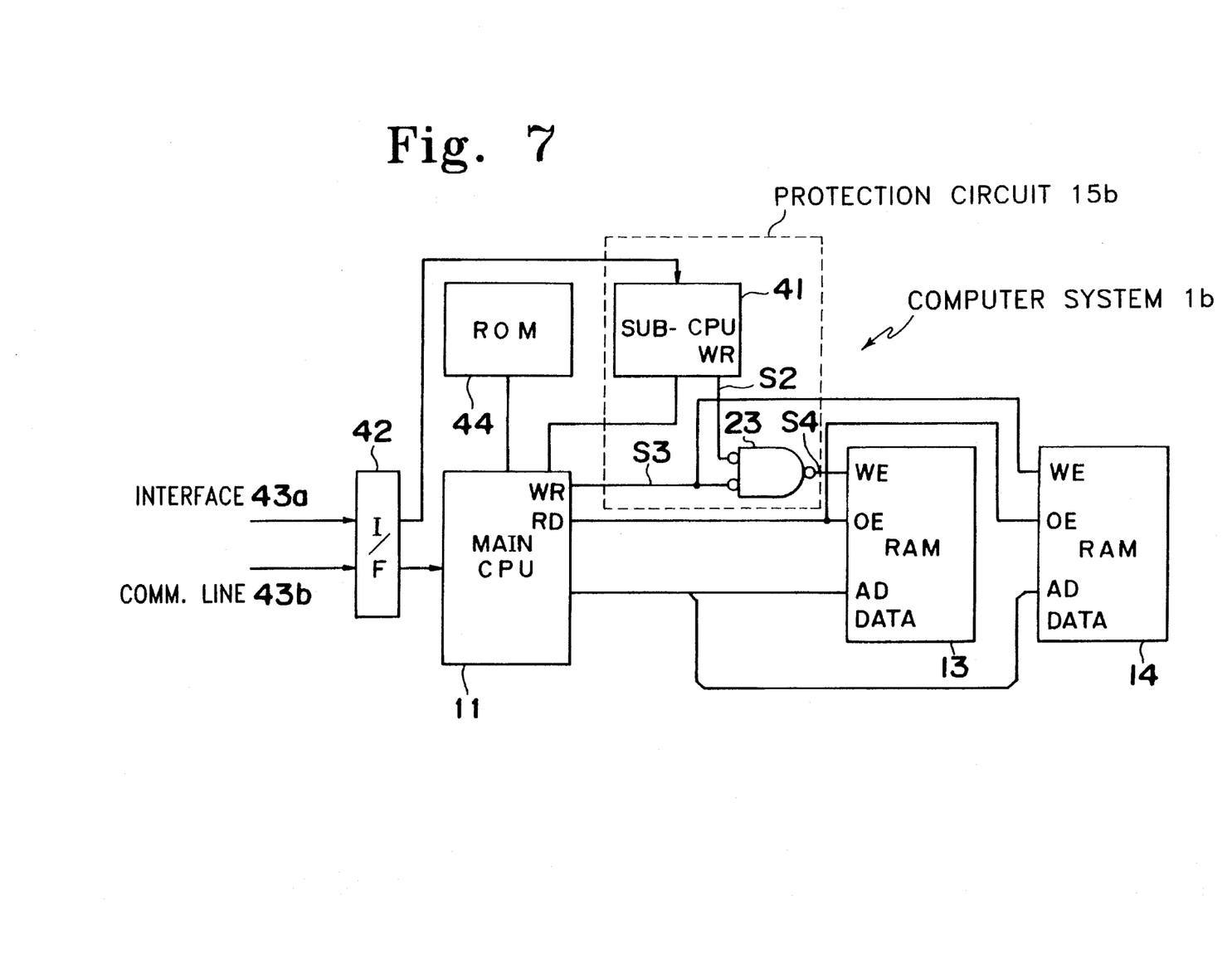
FIG. 7 is a diagram similar to FIG. 1, but according to a third embodiment of the present invention.

FIG. 7 depicts a computer system 1b according to a third embodiment of the present invention.

In this embodiment, programs by which the programs stored in the RAM 13 are desired to be replaced are supplied through a communication line 43a and are inputted to a main CPU 11 via an interface (I/F) 42. Furthermore, a program replacement instruction is inputted to a sub-CPU 41 through another communication line 43b, and a write enable signal S2 is inputted from the sub-CPU 41 to the RAM 13.

The instruction from the communication line 43b allows the programs supplied from the communication line 43a to be written in the RAM 13 for program replacement.

Even in this computer system 1b, unless the sub-CPU 41 is operated by the instruction from the communication line 43b, the contents of the RAM 13 is never rewritten, and the programs stored therein are reliably maintained.

As discussed hereinabove, in each of the computer systems 1, 1a, and 1b, the program replacement can be readily carried out without reducing the reliability in program storage.

In order to enable the writing in the RAM 13, because the computer system 1 itself generates the enable signal S2 (or the pulse signal S2) based on the operations required for the program replacement, the reliability of the system is improved.

In each of the above-described embodiments, because the programs to be executed by the CPU 11 are stored in the RAM 13, a check of products by the use of a plurality of programs can be readily carried out without requiring other devices.

It is to be noted that the gate circuit is not limited by that 23 or 23a discussed above, and any other suitable circuit can be employed as the gate circuit if the circuit can control connection or non-connection of the write signal S3 from the CPU 11 to the WE terminal of the RAM 13.

Furthermore, the construction or circuitry of the protection circuit 15 or 15a, the external ROM card 19 or any other portion of the computer system 1 or 1a, or the contents to be processed therein can be changed or modified.

Although the present invention has been fully described by way of examples with reference to the accompanying drawings, it is to be noted here that various changes and modifications will be apparent to those skilled in the art. Therefore, unless such changes and modifications otherwise depart from the spirit and scope of the present invention, they should be construed as being included therein.

What is claimed is:

1. In a computer system having a CPU and a program memory in which first programs to be executed by the CPU are stored, a program replacement method comprising the steps of:

utilizing, as said program memory, a memory element in which data can be written and read;

providing a protection circuit between a write enable terminal of said program memory and a write signal output terminal of said CPU, said step of providing a protection circuit including the steps of providing an instruction section for instructing program replacement with respect to said program memory; providing a write enable signal generating circuit for generating a write enable signal having a given time interval in response to an instruction from said instruction section; and providing a gate circuit for making, only when the write enable signal is generated, a write signal outputted from said write signal output terminal of said CPU valid with respect to said write enable terminal of said program memory;

generating the write enable signal in response to the instruction from said instruction section; and writing second programs in said program memory, for replacing said first programs stored in said program memory by said second programs.

2. In a computer system having a CPU and a program memory in which first programs to be executed by the CPU are stored, a program replacement method comprising the steps of:

utilizing, as said program memory, a memory element in which data can be written and read;

preparing an external memory having second programs stored therein, said external memory having a protection circuit for connecting a write enable terminal of said program memory to a write signal output terminal of the CPU;

connecting said external memory to said computer system, thereby connecting the write enable terminal of said program memory to the write signal output terminal of said CPU through said protection circuit;

generating an interruption process of said CPU;

transferring said second programs stored in said external memory to said program memory by said generated interruption process for replacing said first programs stored in said program memory by said second programs; and removing said external memory from said computer system, thereby disconnecting the write enable terminal of said program memory from the write signal output terminal of said CPU to protect said second programs stored in said program memory.

3. In a computer system having a CPU and a program memory in which first programs to be executed by the CPU are stored, a program replacement device comprising:

a memory element in which data can be written and read, said memory element being employed as said program memory and having a write enable terminal;

a protection circuit interposed between the write enable terminal of said program memory and a write signal output terminal of said CPU, said protection circuit including an instruction section for instructing program replacement with respect to said program memory; a pulse generating circuit for generating a pulse signal having a given time interval in response to an instruction from said instruction section; and a gate circuit for making, only when the pulse signal is generated, a write signal outputted from said write signal output terminal of said CPU valid with respect to the write enable terminal of said program memory; and an interruption generating circuit for generating in said CPU an interruption required to write second programs in said program memory in response to the instruction from said instruction section for replacing said first programs stored in said program memory by said second programs.

4. A computer system comprising:

a CPU which outputs a write signal from an output port thereof in response to a data writing instruction;

a memory having a write enable terminal in which data are written by the CPU when the write signal is inputted to said write enable terminal; and a protection circuit provided between the write enable terminal of the memory and the output port of the CPU, said protection circuit conducting the write signal from the output port of the CPU to the write enable terminal of the memory for a given time period to write data in said memory and thereafter prohibiting conducting of the write signal to protect the data written in the memory, wherein said protection circuit includes a pulse generator which generates, in response to the data writing instruction, a pulse signal which maintains an active state for the given time period, and a gate circuit which conducts the write signal from the output port of the CPU to the write enable terminal of the memory only when the pulse signal generated by said pulse generator is in an active state.

5. The computer system as claimed in claim 4 wherein said data written in said memory is a program to be executed by said CPU.

6. The computer system as claimed in claim 4 wherein said data writing instruction is outputted by a push switch.

7. The computer system as claimed in claim 6 wherein said data writing instruction is inputted to an interrupt port of the CPU, and the CPU executes an interrupt process to write the data in the memory in response to input of the data writing instruction.

8. The computer system as claimed in claim 7 wherein said CPU writes a program to be executed by itself.

9. A computer system comprising:

a CPU which outputs a write signal from an output port thereof;

a memory having a write enable terminal in which data are written by the CPU when the write signal is inputted to said write enable terminal; and an external memory which is detachably connected to the computer system through a connector, said external memory storing data to be written in said memory and having a first bypass circuit, wherein said first bypass circuit receives the write signal from the output port of the CPU and conducts said received write signal to the write enable terminal of said memory through said connector only when the external memory is connected to said connector, the write enable terminal of the memory being disconnected from the output port of the CPU when said external memory is removed from the computer system, thereby protecting the data written in said memory.

10. The computer system as claimed in claim 9 wherein said external memory further includes a second bypass circuit which receives a data writing instruction signal and conducts said received data writing instruction signal to the CPU in response to connecting the external memory to said connector, and said CPU, in response to said data writing instruction signal, reads the data stored in the external memory and writes said read data in the memory when the write signal is inputted to said write enable terminal of the memory.

11. The computer system as claimed in claim 10 wherein said data writing instruction signal is inputted to an interrupt port of the CPU through said second bypass circuit, and the CPU executes an interrupt process to write the data in the memory in response to input of the data writing instruction signal.

12. The computer system as claimed in claim 9 wherein said data stored in said external memory is a program to be executed by said CPU.

13. The computer system as claimed in claim 9 wherein said external memory is a ROM card.

* * * * *